United States Patent
Akselrod et al.

(10) Patent No.: US 9,667,034 B1
(45) Date of Patent: May 30, 2017

(54) ENHANCED PHOTOLUMINESCENCE

(71) Applicant: Elwha LLC, Bellevue, WA (US)

(72) Inventors: Gleb M. Akselrod, Durham, NC (US); Roderick A. Hyde, Redmond, WA (US); Muriel Y. Ishikawa, Livermore, CA (US); Jordin T. Kare, San Jose, CA (US); Maiken H. Mikkelsen, Durham, NC (US); Tony S. Pan, Bellevue, WA (US); David R. Smith, Durham, NC (US); Clarence T. Tegreene, Mercer Island, WA (US); Yaroslav A. Urzhumov, Bellevue, WA (US); Charles Whitmer, North Bend, WA (US); Lowell L. Wood, Jr., Bellevue, WA (US); Victoria Y. H. Wood, Livermore, CA (US)

(73) Assignee: Elwha LLC

( * ) Notice: Subject to any disclaimer, the term of this patent is extended or adjusted under 35 U.S.C. 154(b) by 0 days.

(21) Appl. No.: 15/193,282

(22) Filed: Jun. 27, 2016

(51) Int. Cl.
*H01S 5/04* (2006.01)
*H01S 5/50* (2006.01)
(Continued)

(52) U.S. Cl.
CPC ............ *H01S 5/1046* (2013.01); *H01S 5/041* (2013.01); *H01S 5/042* (2013.01); *H01S 5/5081* (2013.01); *H01S 3/169* (2013.01)

(58) Field of Classification Search
CPC ........ H01S 5/041; H01S 5/042; H01S 5/1056; H01S 5/5081; H01S 3/169; Y10S 977/773
See application file for complete search history.

(56) References Cited

U.S. PATENT DOCUMENTS

| 7,087,833 B2 * | 8/2006 | Scher ............... B82Y 10/00 136/251 |
| 7,095,058 B2 * | 8/2006 | Gardner ............ B82Y 20/00 257/100 |

(Continued)

OTHER PUBLICATIONS

"Active laser medium"; Wikipedia; bearing a date of May 25, 2016; pp. 1-4; located at https://en.wikipedia.org/wiki/Active_laser_medium.

(Continued)

*Primary Examiner* — Eric Bolda

(57) ABSTRACT

Embodiments include a gain system and method. The system includes a gain medium with a plurality of plasmonic apparatus. Each plasmonic apparatus includes a substrate having a first plasmonic surface, a plasmonic nanoparticle having a second plasmonic surface, and a dielectric-filled gap between the first plasmonic surface and the second plasmonic surface. A plasmonic cavity is created by an assembly of the first plasmonic surface, the second plasmonic surface, and the dielectric-filled gap, and has a first fundamental wavelength $\lambda_1$ and second fundamental wavelength $\lambda_2$. Fluorescent particles are located in the dielectric-filled gap. Each fluorescent particle has an absorption spectrum at the first fundamental wavelength $\lambda_1$ and an emission spectrum at the second fundamental wavelength $\lambda_2$. An excitation applied to the gain medium at the first fundamental wavelength $\lambda_1$ produces an amplified electromagnetic wave emission at the second resonant wavelength $\lambda_2$.

31 Claims, 8 Drawing Sheets

(51) Int. Cl.
*H01S 3/16* (2006.01)
*H01S 5/10* (2006.01)
*H01S 5/042* (2006.01)

(56) References Cited

U.S. PATENT DOCUMENTS

| | | | |
|---|---|---|---|
| 8,389,958 B2 | 3/2013 | Vo-Dinh et al. | |
| 8,908,261 B2 * | 12/2014 | Akselrod | G02B 5/28 257/98 |
| 9,318,866 B2 | 4/2016 | Bora et al. | |
| 2004/0155184 A1 | 8/2004 | Stockman et al. | |
| 2007/0114431 A1 * | 5/2007 | Wang | G02B 1/007 250/370.14 |
| 2009/0219623 A1 * | 9/2009 | Shalaev | B82Y 20/00 359/642 |
| 2012/0064134 A1 | 3/2012 | Bourke, Jr. et al. | |
| 2012/0178099 A1 | 7/2012 | Jana | |
| 2013/0148682 A1 | 6/2013 | Zhang et al. | |
| 2013/0171060 A1 | 7/2013 | Vo-Dinh et al. | |
| 2014/0269806 A1 | 9/2014 | Bora et al. | |
| 2014/0354992 A1 | 12/2014 | Lin et al. | |
| 2014/0354993 A1 | 12/2014 | Lin et al. | |
| 2016/0126500 A1 | 5/2016 | Uesaka et al. | |

OTHER PUBLICATIONS

Akselrod, Gleb et al.; "Leveraging Nanocavity Harmonics for Control of Optical Processes in 2D Semiconductors"; Nano Letters; 2015; pp. 3578-3584; vol. 15; American Chemical Society.

"Plasmonics"; nanoComposix; bearing a date of May 23, 2016; pp. 1-4; located at http://nanocomposix.com/pages/plasmonics.

Zheng, Jie; "Fluorescent Noble Metal Nanoclusters" A Thesis presented to the Academic Faculty at Georgia Institute of Technology; bearing a date of Apr. 2005; pp. 1-169.

* cited by examiner

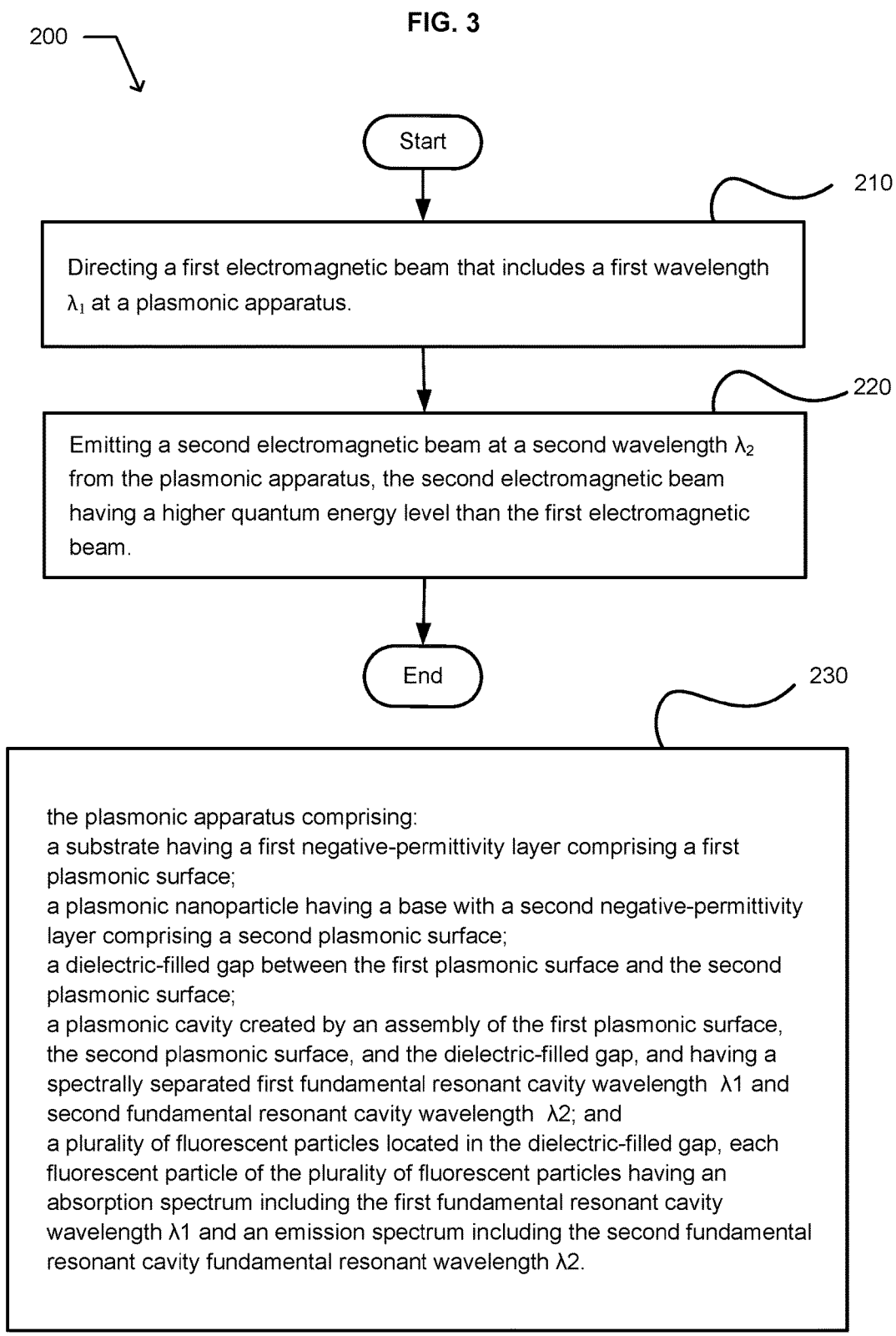

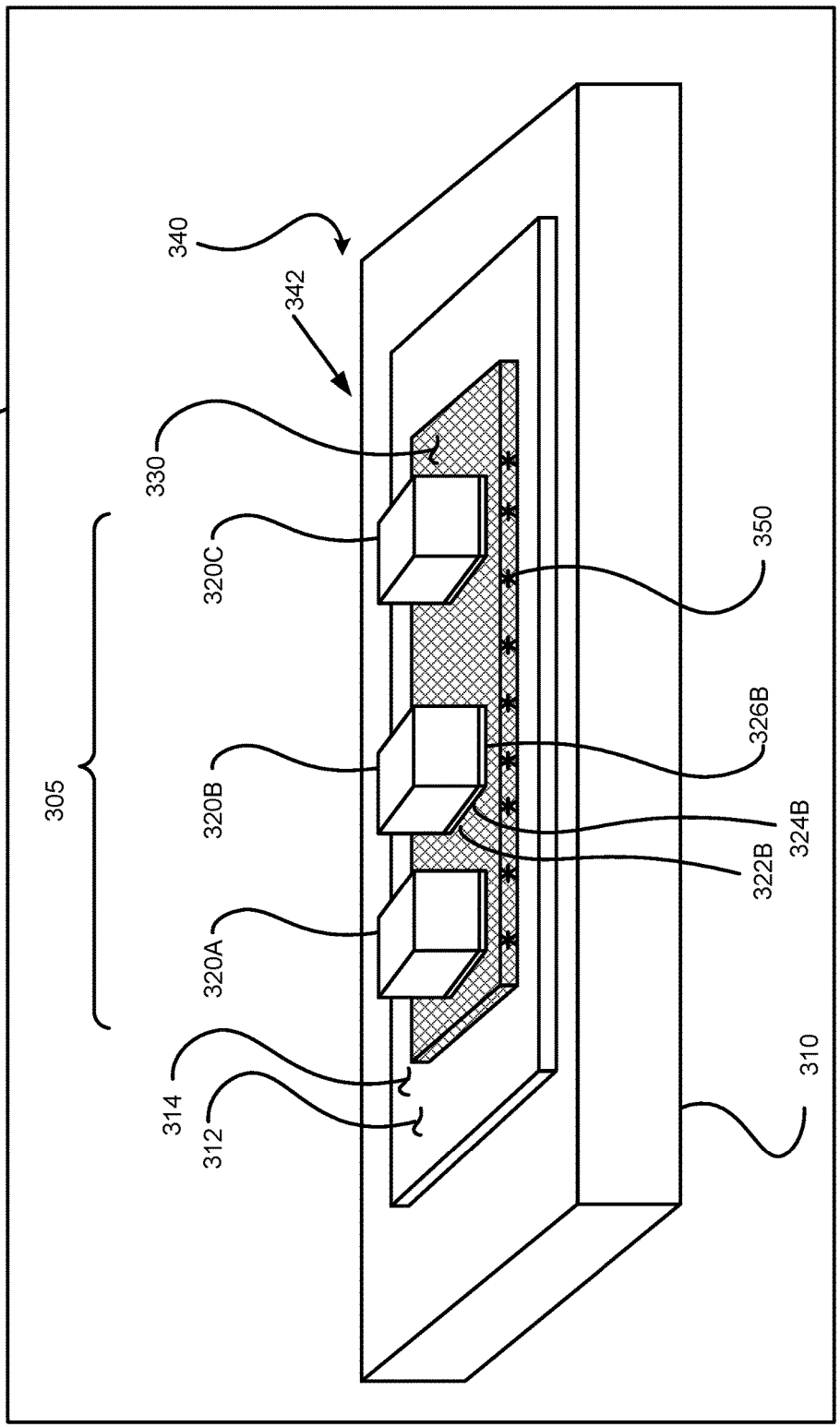

FIG. 5

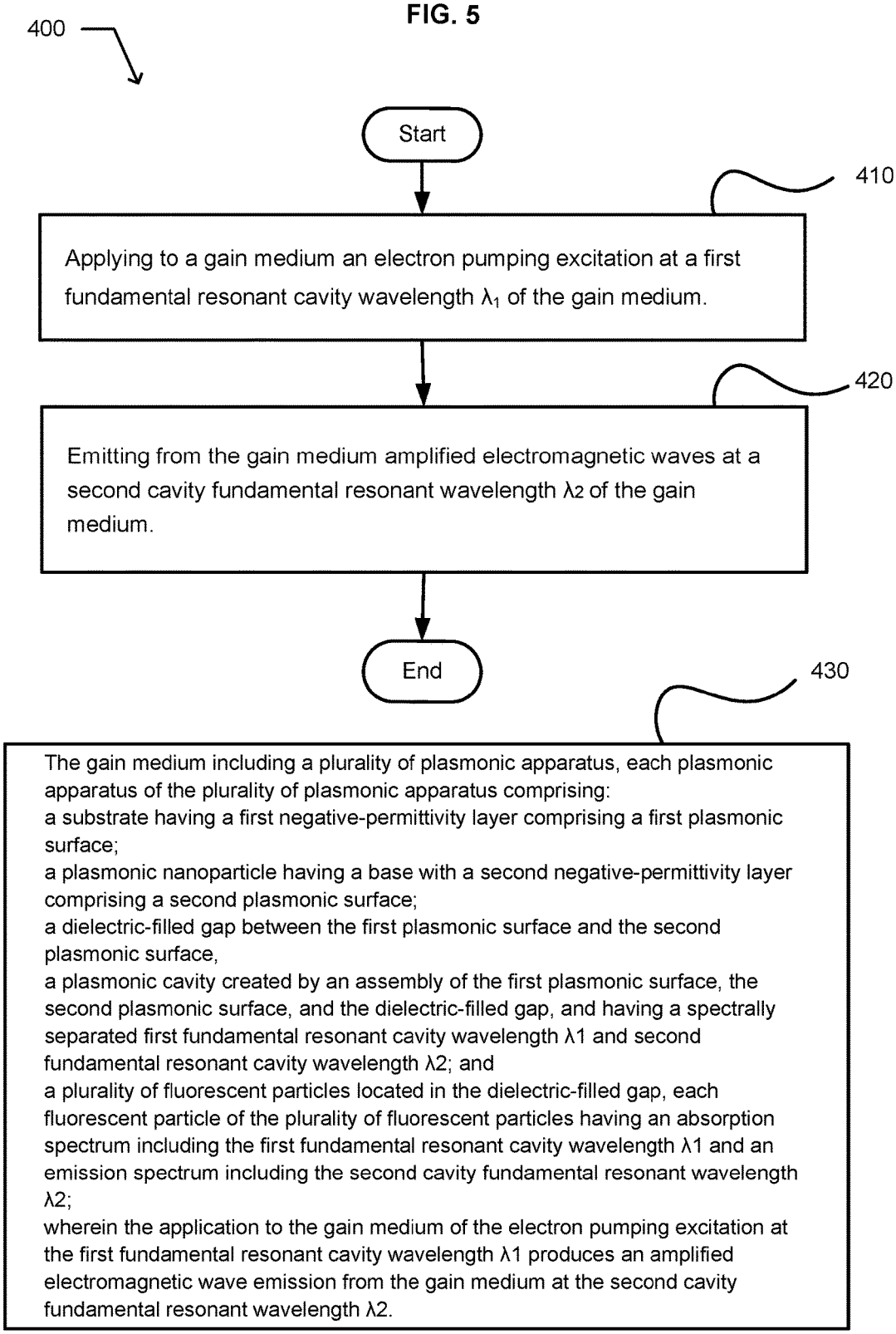

400

Start

410
Applying to a gain medium an electron pumping excitation at a first fundamental resonant cavity wavelength $\lambda_1$ of the gain medium.

420
Emitting from the gain medium amplified electromagnetic waves at a second cavity fundamental resonant wavelength $\lambda_2$ of the gain medium.

End

430
The gain medium including a plurality of plasmonic apparatus, each plasmonic apparatus of the plurality of plasmonic apparatus comprising:
a substrate having a first negative-permittivity layer comprising a first plasmonic surface;
a plasmonic nanoparticle having a base with a second negative-permittivity layer comprising a second plasmonic surface;
a dielectric-filled gap between the first plasmonic surface and the second plasmonic surface,
a plasmonic cavity created by an assembly of the first plasmonic surface, the second plasmonic surface, and the dielectric-filled gap, and having a spectrally separated first fundamental resonant cavity wavelength $\lambda 1$ and second fundamental resonant cavity wavelength $\lambda 2$; and
a plurality of fluorescent particles located in the dielectric-filled gap, each fluorescent particle of the plurality of fluorescent particles having an absorption spectrum including the first fundamental resonant cavity wavelength $\lambda 1$ and an emission spectrum including the second cavity fundamental resonant wavelength $\lambda 2$;
wherein the application to the gain medium of the electron pumping excitation at the first fundamental resonant cavity wavelength $\lambda 1$ produces an amplified electromagnetic wave emission from the gain medium at the second cavity fundamental resonant wavelength $\lambda 2$.

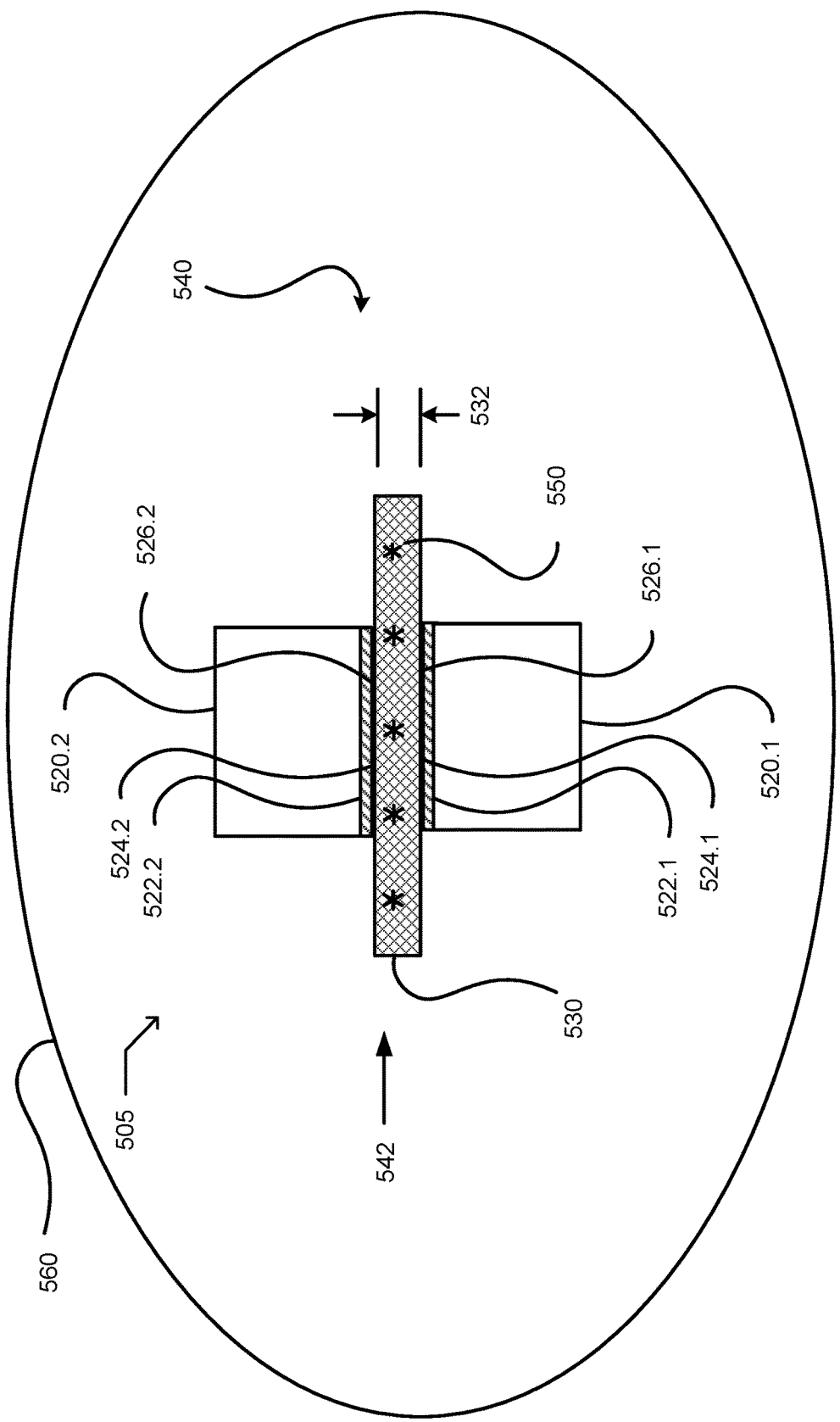

ENHANCED PHOTOLUMINESCENCE

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)).

PRIORITY APPLICATIONS

NONE

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

For example, and without limitation, an embodiment of the subject matter described herein includes an electromagnetic gain system. The electromagnetic gain system includes a gain medium that includes a plurality of plasmonic apparatus. The gain system includes the plurality of plasmonic apparatus. Each plasmonic apparatus of the plurality of plasmonic apparatus includes a substrate having a first negative-permittivity layer comprising a first plasmonic surface. Each plasmonic apparatus of the plurality of plasmonic apparatus includes a plasmonic nanoparticle having a base with a second negative-permittivity layer comprising a second plasmonic surface. Each plasmonic apparatus of the plurality of plasmonic apparatus including a dielectric-filled gap between the first plasmonic surface and the second plasmonic surface. Each plasmonic apparatus of the plurality of plasmonic apparatus includes a plasmonic cavity created by an assembly of the first plasmonic surface, the second plasmonic surface, and the dielectric-filed gap, and having a spectrally separated first fundamental resonant cavity wavelength $\lambda_1$ and second fundamental resonant cavity wavelength $\lambda_2$. Each plasmonic apparatus of the plurality of plasmonic apparatus includes a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$. Wherein an application to the gain medium of an electron pumping excitation at the first fundamental resonant cavity wavelength $\lambda_1$ produces an amplified electromagnetic wave emission from the gain medium at the second fundamental resonant cavity wavelength $\lambda_2$.

In an embodiment, the gain system includes an electron pumping apparatus configured to excite the gain medium at the first fundamental resonant cavity wavelength $\lambda_1$.

For example, and without limitation, an embodiment of the subject matter described herein includes a method. The method includes applying to a gain medium an electron pumping excitation at a first fundamental resonant cavity wavelength $\lambda_1$ of the gain medium. The method includes emitting from the gain medium an amplified electromagnetic wave at a second fundamental resonant cavity wavelength $\lambda_2$ of the gain medium. The gain medium includes a plurality of plasmonic apparatus. Each plasmonic apparatus of the plurality of plasmonic apparatus includes a substrate having a first negative-permittivity layer comprising a first plasmonic surface. Each plasmonic apparatus includes a plasmonic nanoparticle having a base with a second negative-permittivity layer comprising a second plasmonic surface. Each plasmonic apparatus includes a dielectric-filled gap between the first plasmonic surface and the second plasmonic surface. Each plasmonic apparatus includes a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. Each plasmonic apparatus includes a plurality of fluorescent particles located in the dielectric-filled gap. Each fluorescent particle of the plurality of fluorescent particles having an absorption spectrum including the first fundamental resonant cavity wavelength $\lambda_1$ and an emission spectrum including the second fundamental resonant cavity wavelength $\lambda_2$. Wherein the application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$.

For example, and without limitation, an embodiment of the subject matter described herein includes a plasmonic nanoparticle dimer. The plasmonic nanoparticle dimer includes a first plasmonic nanoparticle having a base with a second negative-permittivity layer comprising a second plasmonic surface. The plasmonic nanoparticle dimer includes a second plasmonic nanoparticle having a base with a second negative-permittivity layer comprising a second plasmonic surface. The plasmonic nanoparticle dimer includes dielectric-filled gap between the first plasmonic outer surface and the second plasmonic outer surface. The plasmonic nanoparticle dimer includes a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. The plasmonic nanoparticle dimer includes a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$.

For example, and without limitation, an embodiment of the subject matter described herein includes an electromagnetic wave gain system. The electromagnetic wave gain system including a dispersion of a plurality of plasmonic nanoparticle dimers in a gain medium. Each plasmonic nanoparticle dimer of the plurality of plasmonic nanoparticle dimers including first plasmonic nanoparticle having a base with a second negative-permittivity layer comprising a second plasmonic surface. Each plasmonic nanoparticle dimer of the plurality of plasmonic nanoparticle dimers including a second plasmonic nanoparticle having a base with a second negative-permittivity layer comprising a second plasmonic surface. Each plasmonic nanoparticle dimer of the plurality of plasmonic nanoparticle dimers including dielectric-filled gap between the first plasmonic outer surface and the second plasmonic outer surface. Each plasmonic nanoparticle dimer of the plurality of plasmonic nanoparticle dimers including a plasmonic cavity created by an assembly of the first plasmonic surface, the second plasmonic surface, and the dielectric-filled gap, and having a spectrally separated first fundamental resonant cavity wavelength λ1 and second fundamental resonant cavity wavelength λ2. Each plasmonic nanoparticle dimer of the plurality of plasmonic nanoparticle dimers including a plurality of fluorescent particles located in the dielectric-filled gap, each fluorescent particle of the plurality of fluorescent particles having an absorption spectrum including the first fundamental resonant cavity wavelength λ1 and an emission spectrum including the second fundamental resonant cavity wavelength λ2. Each plasmonic nanoparticle dimer of the plurality of plasmonic nanoparticle dimers including the gain medium. Wherein an application to the gain medium of an electron pumping excitation at the first fundamental resonant cavity wavelength λ1 produces an amplified electromagnetic wave emission from the gain medium at the second fundamental resonant cavity wavelength λ2.

In an embodiment, the gain system includes an electron pumping apparatus configured to excite the gain medium at the first fundamental resonant cavity wavelength $\lambda_1$.

For example, and without limitation, an embodiment of the subject matter described herein includes a method. The method includes applying to a gain medium an electron pumping excitation at a first fundamental resonant cavity wavelength $\lambda_1$ of the gain medium. The method includes emitting from the gain medium amplified electromagnetic waves at a second fundamental resonant cavity wavelength $\lambda_2$ of the gain medium. The gain medium includes a plurality of plasmonic nanoparticle dimers. Each plasmonic nanoparticle dimer of the plurality of plasmonic nanoparticle dimers includes first plasmonic nanoparticle having a base with a second negative-permittivity layer comprising a second plasmonic surface. Each plasmonic nanoparticle dimer includes a second plasmonic nanoparticle having a base with a second negative-permittivity layer comprising a second plasmonic surface. Each plasmonic nanoparticle dimer includes dielectric-filled gap between the first plasmonic outer surface and the second plasmonic outer surface. Each plasmonic nanoparticle dimer includes a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. Each plasmonic nanoparticle dimer includes a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$. Application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 illustrates an example operational flow;

FIG. 4 illustrates an example gain system;

FIG. 5 illustrates an example operational flow for amplifying electromagnetic waves;

FIG. 6 illustrates an example plasmonic nanoparticle dimer;

DETAILED DESCRIPTION

Figure 1:
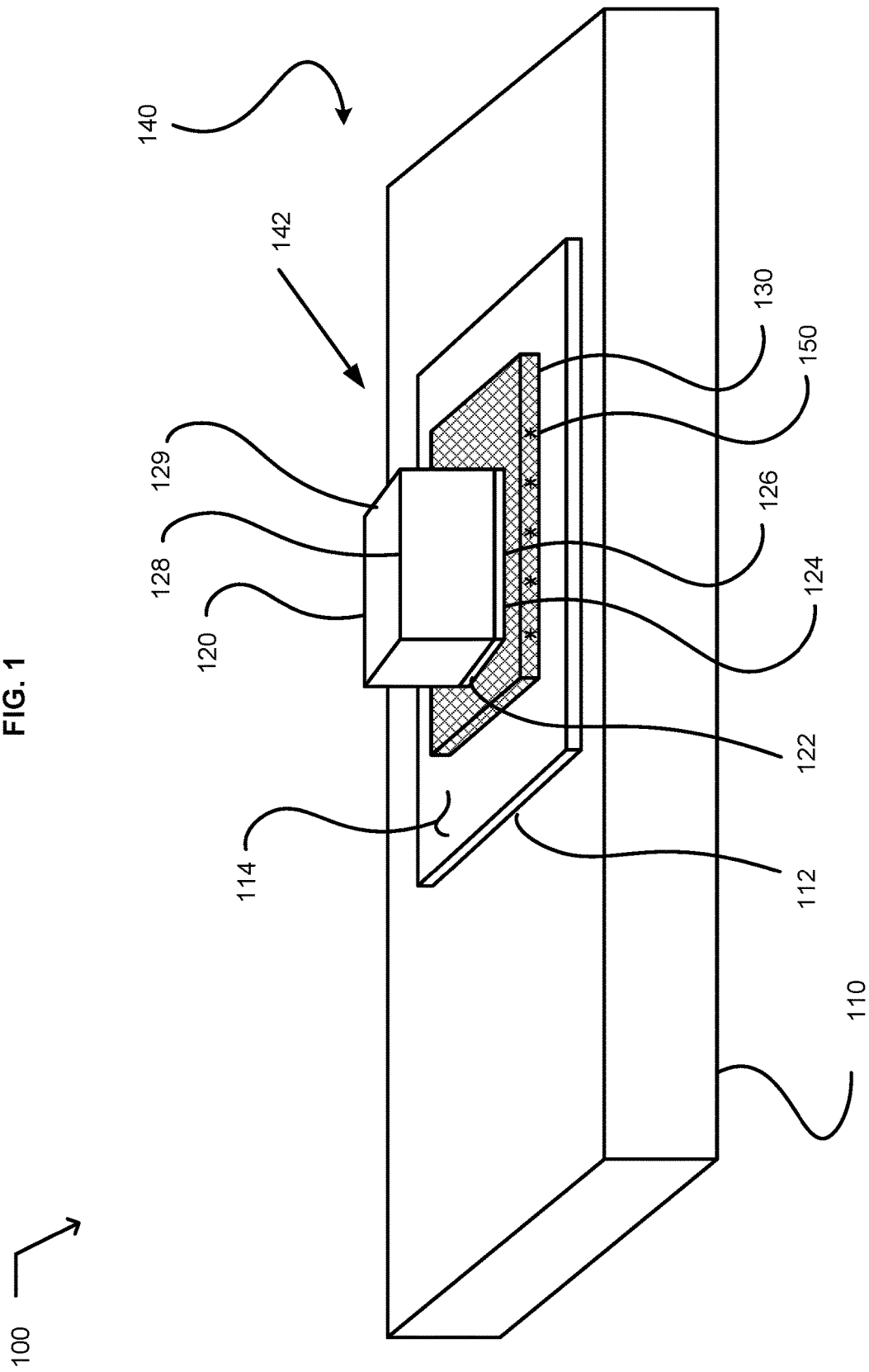
FIG. 1 illustrates a perspective view of an example plasmonic apparatus.

This application makes reference to technologies described more fully in U.S. patent application No. 15/193,271, entitled ENHANCED PHOTOLUMINESCENCE, naming Gleb M. Akselrod, Roderick A. Hyde, Muriel Y. Ishikawa, Jordin T. Kare, Maiken H. Mikkelsen, Tony S. Pan, David R. Smith, Clarence T. Tegreene, Yaroslav A. Urzhumov, Charles Whitmer, Lowell L. Wood, Jr., and Victoria Y. H. Wood as inventors, filed on Jun. 27, 2016, is related to the present application. That application is incorporated by reference herein, including any subject matter included by reference in that application.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various implementations by which processes and/or systems and/or other technologies described herein can be effected (e.g., hardware, software, and/or firmware), and that the preferred implementation will vary with the context in which the processes and/or systems and/or other technologies are deployed. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Hence, there are several possible implementations by which the processes and/or devices and/or other technologies described herein may be effected, none of which is inherently superior to the other in that any implementation to be utilized is a choice dependent upon the context in which the implementation will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures suitable to implement an operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described below. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those skilled in the art will recognize how to obtain, configure, and optimize suitable transmission or computational elements, material supplies, actuators, or other common structures in light of these teachings.

Figure 2:
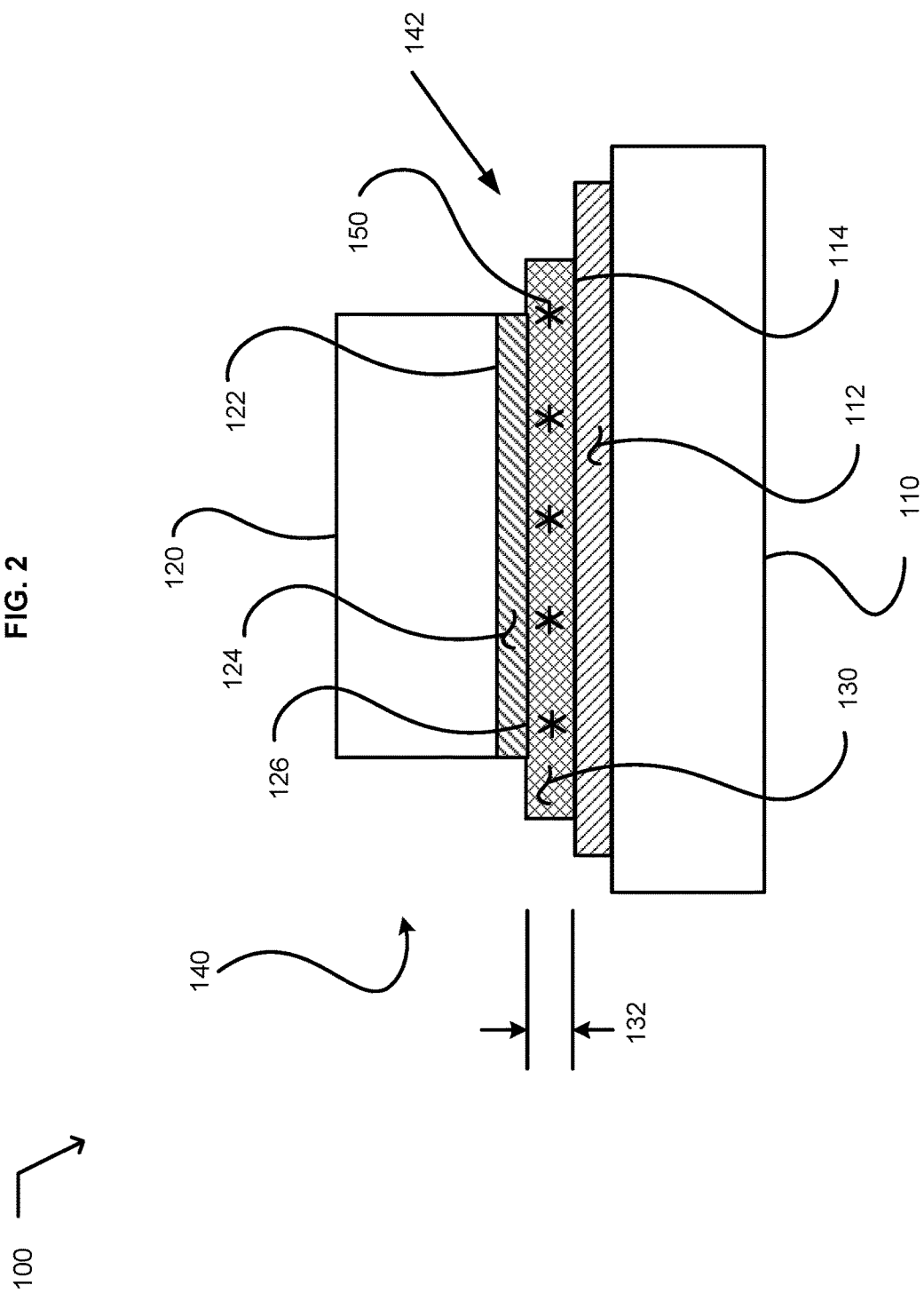
FIG. 2 illustrates a side view of the example plasmonic apparatus.

FIG. 1 illustrates a perspective view of an example plasmonic apparatus 100. FIG. 2 illustrates a side view of the example plasmonic apparatus 100. The plasmonic apparatus includes a substrate 110 having a first negative-permittivity layer 112 comprising a first plasmonic surface 114. The plasmonic apparatus includes a plasmonic nanoparticle 120 having a base 122 with a second negative-permittivity layer 124 comprising a second plasmonic surface 126. The plasmonic apparatus includes a dielectric-filled gap 130 between the first plasmonic surface and the second plasmonic surface. A plasmonic cavity 142 created by an assembly 140 of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. The plasmonic apparatus includes a plurality of fluorescent particles 150 located in the dielectric-filled gap 130. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$.

In an embodiment of the plasmonic cavity 142, the first fundamental resonant cavity wavelength $\lambda_1$ is a function of a first characteristic of the plasmonic nanoparticle 120 and the second fundamental resonant cavity wavelength $\lambda_2$ is a function of a second characteristic of the plasmonic nanoparticle. In an embodiment of the plasmonic cavity, the first fundamental resonant cavity wavelength $\lambda_1$ is a function of a first structural characteristic of the plasmonic nanoparticle and the second fundamental resonant cavity wavelength $\lambda_2$ is a function of a second structural characteristic of the plasmonic nanoparticle. In an embodiment of the plasmonic cavity, the first fundamental resonant cavity wavelength $\lambda_1$ is a function of a first dimensional characteristic of the plasmonic nanoparticle and the second fundamental resonant cavity wavelength $\lambda_2$ is a function of a second dimensional characteristic of the plasmonic nanoparticle. In an embodiment of the plasmonic cavity, the first fundamental resonant cavity wavelength $\lambda_1$ is a function of a first side dimension 128 of the non-square rectangular base 122 of the plasmonic nanoparticle and the second fundamental resonant cavity wavelength $\lambda_2$ is a function of a second side dimension 129 of the non-square rectangular base of the plasmonic nanoparticle. For example, a non-square rectangular base of the plasmonic nanoparticle may be 40×10 nm, or 40×20 nm.

In an embodiment of the plasmonic nanoparticle 120, the base 122 of the plasmonic nanoparticle is at least substantially conformal to the first plasmonic surface 114. In an embodiment of the plasmonic nanoparticle, the base of the plasmonic nanoparticle is at least substantially planar. In an embodiment of the plasmonic nanoparticle, the base of the plasmonic nanoparticle has a major side 128, and a minor side 129 shorter than the major side. In an embodiment of the plasmonic nanoparticle, the major side corresponds to a base dimension in a first direction and the minor side corresponds to a shorter base dimension in a non-aligned direction. In an embodiment of the plasmonic nanoparticle, the non-aligned direction is at least substantially perpendicular to the first direction. In an embodiment, the plasmonic nanoparticle includes at least two joined or proximate plasmonic nanoparticles forming the base with their combined second negative-permittivity layers 124 comprising the second plasmonic surface 126. For example, the at least two plasmonic nanoparticles may be arranged in a 1×2, 2×5, 3×4, or 5×9 configuration. In an embodiment of the plasmonic nanoparticle, the at least two joined or proximate plasmonic nanoparticles form a non-square rectangular base with a combined second negative-permittivity layer comprising a second plasmonic surface.

In an embodiment of the plasmonic nanoparticle 120, the plasmonic nanoparticle includes a nanorod having a non-square rectangular base 122 with the second negative-permittivity layer 124. In an embodiment of the plasmonic nanoparticle, the base of the plasmonic nanoparticle includes at least one of a rectangular, an ellipsoidal, or a triangular shape. In an embodiment of the plasmonic nanoparticle, the base of the plasmonic nanoparticle has an elongated shape. In an embodiment of the plasmonic nanoparticle, the base of the plasmonic nanoparticle has an arbitrary shape. In an embodiment of the plasmonic nanoparticle, the base of the plasmonic nanoparticle has a major side 128 length ranging between 10-10000 nm. In an embodiment of the plasmonic nanoparticle, the base of the plasmonic nanoparticle has a major side length between about 100 and about 1000 nm. In an embodiment of the plasmonic nanoparticle, the base of the plasmonic nanoparticle has a major side length ranging between 500 and 7000 nm.

In an embodiment, the plasmonic cavity 142 has a spectrally separated first spectral resonant envelope that includes the first fundamental resonant wavelength $\lambda_1$ and a second spectral resonant envelope that includes the second fundamental resonant wavelength $\lambda_2$. In an embodiment, the first spectral resonant envelope and the second spectral resonant envelope are substantially non-overlapping. In an embodiment, the first fundamental resonant wavelength $\lambda_1$ and second fundamental resonant wavelength $\lambda_2$ of the plasmonic cavity are both in the ultraviolet spectrum. In an embodiment, the first fundamental resonant wavelength $\lambda_1$ is in the ultraviolet spectrum and second fundamental resonant wavelength $\lambda_2$ of the plasmonic cavity is in the visible light spectrum. In an embodiment, the first fundamental resonant wavelength $\lambda_1$ is in the ultraviolet spectrum and second fundamental resonant wavelength $\lambda_2$ of the plasmonic cavity is in the infrared spectrum. In an embodiment, the first fundamental resonant wavelength $\lambda_1$ and second fundamental resonant wavelength $\lambda_2$ of the plasmonic cavity are both in the visible light spectrum. In an embodiment, the first fundamental resonant wavelength $\lambda_1$ is in the visible light spectrum and second fundamental resonant wavelength $\lambda_2$ of the plasmonic cavity is in the infrared spectrum. In an embodiment, the first fundamental resonant wavelength $\lambda_1$ and second fundamental resonant wavelength $\lambda_2$ of the plasmonic cavity are both in the infrared spectrum. In an embodiment, the second fundamental resonant cavity wavelength $\lambda_2$ of the plasmonic nanoparticle is a harmonic of the first fundamental resonant cavity wavelength $\lambda 1$ of the plasmonic cavity. In an embodiment, a ratio of the second fundamental resonant cavity wavelength $\lambda_2$ to the first fundamental resonant cavity wavelength $\lambda_1$ is an integer. In an embodiment, a ratio of the second fundamental resonant cavity wavelength $\lambda_2$ to the first fundamental resonant cavity wavelength $\lambda_1$ is a rational number. For example, a rational number may include 3/2. In an embodiment, the second fundamental resonant cavity wavelength $\lambda_2$ is a $3^{rd}$ harmonic of the first fundamental resonant cavity wavelength $\lambda_1$ of the plasmonic cavity; and each fluorescent particle of the plurality of fluorescent particles includes a fluorescent particle with a $3^{rd}$ harmonic nonlinearity having an emission spectrum including the second fundamental resonant cavity wavelength $\lambda_2$. For example, a $3^{rd}$ order plasmonic nanoparticle may be built by binding three plasmonic nanocubes together in a 1×3 configuration. For example, doubly-resonant nanocubes may be assembled, such as with a non-square rectangular base, to generate 3rd harmonic light from nonlinear materials. For example, a fluorescent material with a 3rd harmonic nonlinearity may be placed in the dialectic-filled gap 130. The strong electric field components of the resonant field are expected to generate 3rd harmonic light.

In an embodiment of the dielectric-filled gap 130, the dielectric includes a non-linear optical material having a non-linear response configured to enhance emission at the second fundamental resonant cavity wavelength $\lambda_2$.

In an embodiment, the plasmonic nanoparticle 120 includes a plurality of plasmonic nanoparticles. Each plasmonic nanoparticle of the plurality of plasmonic nanoparticles has a base 122 with the second negative-permittivity layer 124 comprising the second plasmonic surface 126. In an embodiment, the plasmonic nanoparticle includes a doubly-resonant plasmonic nanoparticle. In an embodiment, at least one of the plasmonic nanoparticle 120, the substrate 110, or the dielectric 130 includes a nonlinear harmonic material. In this embodiment, the first fundamental resonant cavity wavelength $\lambda_1$ is a fundamental resonant cavity wavelength of the nonlinear harmonic material and the second fundamental resonant cavity wavelength $\lambda_2$ is a harmonic wavelength of the fundamental resonant cavity wavelength.

In an embodiment of the plasmonic apparatus 100, the first plasmonic surface 114 is coated with at least two fluorescent particles of the plurality of fluorescent particles 150. In an embodiment of the plasmonic apparatus, the second plasmonic surface 126 is coated with at least two fluorescent particles of the plurality of fluorescent particles.

In an embodiment of the plasmonic apparatus 100, the plurality of fluorescent particles 150 are included in the dielectric-filled gap 130. In an embodiment, the dielectric-filed gap is a subwavelength dielectric-filled gap. In an embodiment of the plasmonic apparatus, the plasmonic cavity 142 includes a plasmonic subwavelength cavity. In an embodiment of the plasmonic apparatus, the plasmonic cavity includes a plasmonic resonator.

In an embodiment of the plasmonic apparatus 100, the first plasmonic surface 114 includes an adhesive configured to bond the first plasmonic surface with the dielectric material of the dielectric-filled gap 130. In an embodiment of the plasmonic apparatus, the first negative-permittivity layer 112 has negative permittivity within a defined wavelength range. In an embodiment of the plasmonic apparatus, the second negative-permittivity layer 124 has negative permittivity within a defined wavelength range. In an embodiment of the plasmonic apparatus, the first negative-permittivity layer includes a metallic layer. In an embodiment of the plasmonic apparatus, the first negative-permittivity layer includes a semi-metallic layer. In an embodiment of the plasmonic apparatus, the first negative-permittivity layer includes a semiconductor layer. In an embodiment of the plasmonic apparatus, the first negative-permittivity layer includes a polaritonic dielectric layer. In an embodiment of the plasmonic apparatus, the second negative-permittivity layer at least partially covers the base of the plasmonic nanoparticle 120. In an embodiment of the plasmonic apparatus, the second negative-permittivity layer is formed over at least the base 122 of the plasmonic nanoparticle. In an embodiment of the plasmonic apparatus, the second negative-permittivity layer includes a noble metal. In an embodiment of the plasmonic apparatus, the second negative-permittivity layer includes a metallic layer. In an embodiment of the plasmonic apparatus, the second negative-permittivity layer includes a semimetal layer. In an embodiment of the plasmonic apparatus, the second negative-permittivity layer includes a semiconductor layer or a polaritonic dielectric layer. In an embodiment of the plasmonic apparatus, the second negative-permittivity layer includes an adhesive configured to bond the second negative-permittivity layer with a dielectric material of the dielectric-filled gap. In an embodiment of the plasmonic apparatus, the at least a portion of the dielectric-filled gap includes a dielectric coating applied to the first plasmonic surface of the substrate. In an embodiment of the plasmonic apparatus, the at least a portion of the dielectric-filled gap includes a dielectric coating applied to the second plasmonic surface of the plasmonic nanoparticle.

In an embodiment of the plasmonic apparatus 100, the dielectric-filled gap 130 is less than 5 nm thick 132. In an embodiment of the plasmonic apparatus, the dielectric-filled gap is less than 100 nm thick. In an embodiment of the plasmonic apparatus, the dielectric-filled gap is less than 50 nm thick. In an embodiment of the plasmonic apparatus, the dielectric-filled gap is less than 25 nm. In an embodiment of the plasmonic apparatus, the dielectric-filled gap is greater than 0 nm and less than 50 nm. In an embodiment of the plasmonic apparatus, the dielectric-filled gap is greater than 5 nm. In an embodiment of the plasmonic apparatus, the dielectric material of the dielectric-filled gap 130 includes a hard or soft dielectric material.

In an embodiment of the plasmonic apparatus 100, each fluorescent particle of the plurality of fluorescent particles 150 has an absorption peak or maxima at a wavelength substantially aligned with the first fundamental resonant cavity wavelength $\lambda_1$ and an emission peak or maxima substantially aligned with the second fundamental resonant cavity wavelength $\lambda_2$. In an embodiment, each fluorescent particle of the plurality of fluorescent particles 150 has an absorption maxima at a wavelength substantially aligned with the first fundamental resonant cavity wavelength $\lambda_1$ and an emission maxima substantially aligned with the second fundamental resonant cavity wavelength $\lambda_2$. In an embodiment of the plasmonic apparatus, the plurality of fluorescent particles 150 includes a plurality of fluorescent molecules. In an embodiment of the plasmonic apparatus, the plurality of fluorescent particles includes a plurality of fluorescent carbon particles. For example, fluorescent carbon particles are described in N. Ranjan, *Highly Fluorescent Carbon Nanoparticles*, U.S. Pat. Pub. No. 20120178099 (published Jul. 12, 2012). In an embodiment of the plasmonic apparatus, the plurality of fluorescent particles includes a plurality of fluorescent semiconductor crystals. In an embodiment of the plasmonic apparatus, the plurality of fluorescent particles includes a plurality of fluorescent metal particles. In an embodiment of the plasmonic apparatus, the plurality of fluorescent particles includes a plurality of fluorescent quantum dots. In an embodiment of the plasmonic apparatus, the plurality of fluorescent particles includes a plurality of fluorescent proteins. For example, fluorescent proteins may include green fluorescent proteins.

In an embodiment of the plasmonic apparatus 100, the substrate 110 is another base of another plasmonic nanoparticle. See FIG. 8, infra. In an embodiment of the plasmonic apparatus, the another base of the another plasmonic nanoparticle has a shape at least substantially similar to a shape of the base 122 of the plasmonic nanoparticle 120. In an embodiment of the plasmonic apparatus 100, the another base of the another plasmonic nanoparticle has a shape that overlaps a shape of the base of the plasmonic nanoparticle. For example, the base of the another plasmonic nanoparticle may have a larger surface area than the base of the plasmonic nanoparticle.

FIGS. 1 and 2 illustrate another embodiment of the plasmonic apparatus 100. The plasmonic apparatus includes the substrate 110 having the first negative-permittivity layer 112 comprising the first plasmonic surface 114. The plasmonic apparatus includes the plasmonic nanoparticle 120 having a base 122 with the second negative-permittivity layer 124 comprising the second plasmonic surface 126. The plasmonic apparatus includes the dielectric-filled gap 130 between the first plasmonic surface and the second plasmonic surface. A plasmonic cavity 142 created by an assembly 140 of the first plasmonic surface, the second plasmonic surface, and the dielectric-filed gap, and having a spectrally separated first fundamental resonant cavity wavelength $\lambda_1$ and second resonant cavity wavelength $\lambda_2$ that is a $3^{rd}$ harmonic of the first fundamental resonant cavity wavelength $\lambda_1$. The plasmonic apparatus includes the plurality of fluorescent particles 150 located in the dielectric-filled gap. Each fluorescent particle of the plurality of fluorescent particles has an absorption spectrum including the first fundamental resonant cavity wavelength $\lambda_1$ and a $3^{rd}$ harmonic nonlinearity with an emission spectrum including the second resonant cavity wavelength $\lambda_2$.

In an embodiment of the plasmonic apparatus 100, each fluorescent particle of the plurality of fluorescent particles 150 has an absorption peak at a wavelength substantially aligned with the first fundamental resonant cavity wavelength $\lambda_1$ and a $3^{rd}$ harmonic nonlinearity with an emission peak at a wavelength substantially aligned with the second resonant cavity wavelength $\lambda_2$.

FIG. 3 illustrates an example operational flow 200. After a start operation, the operational flow includes a photoexcitation operation 210. The photoexcitation operation includes directing a first electromagnetic beam that includes a first wavelength $\lambda_1$ at a plasmonic apparatus. A photoluminescence operation 220 includes emitting a second electromagnetic beam at a second wavelength $\lambda_2$ from the plasmonic apparatus. The second electromagnetic beam has a higher quantum energy level than the first electromagnetic beam. The plasmonic apparatus comprising a substrate has a first negative-permittivity layer comprising a first plasmonic surface. The plasmonic apparatus comprising a plasmonic nanoparticle having a base with a second negative-permittivity layer comprising a second plasmonic surface. The plasmonic apparatus comprising a dielectric-filled gap between the first plasmonic surface and the second plasmonic surface. A plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. The plasmonic apparatus comprising a plurality of fluorescent particles located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$. The operational flow includes an end operation.

FIG. 4 illustrates an example gain system 300. The gain system includes a gain medium 302. The gain medium includes a plurality of plasmonic apparatus 305. Each plasmonic apparatus of the plurality of plasmonic apparatus includes a substrate having a first negative-permittivity layer comprising a first plasmonic surface and an associated at least one plasmonic nanoparticle having a base with a second negative-permittivity layer comprising a second plasmonic surface. FIG. 4 illustrates a configuration of the plasmonic apparatus with a plurality of plasmonic nanoparticles 320A, 320B, and 320C in a spaced-apart linear arrangement relative to a single substrate 310 having a first negative-permittivity layer 312 comprising a first plasmonic surface 314. While the plurality of plasmonic nanoparticles is illustrated in a spaced-apart linear arrangement, they may be arranged in any manner on the substrate, for example in a grid format. In another embodiment, a configuration of the plasmonic apparatus may include a single plasmonic surface and a single plasmonic nanoparticle. In an embodiment, the plurality of plasmonic apparatus are suspended in, carried by, or incorporated into the gain medium. The gain system includes the plurality of plasmonic apparatus. Each plasmonic apparatus of the plurality of plasmonic apparatus includes a substrate 310 having a first negative-permittivity layer 312 comprising a first plasmonic surface 314.

While each plasmonic apparatus 305 may be associated with an individual substrate, FIG. 4 illustrates the substrate 310 having a first negative-permittivity layer 312 comprising a first plasmonic surface 314. Each plasmonic apparatus of the plurality of plasmonic apparatus further includes the plurality of plasmonic nanoparticles 305 each having a base with a second negative-permittivity layer comprising a second plasmonic surface, illustrated by plasmonic nanoparticle 320B having a base 322B with a second negative-permittivity layer 324B comprising a second plasmonic surface 326B. Each plasmonic apparatus of the plurality of plasmonic apparatus includes a dielectric-filled gap 330 between the first plasmonic surface and the second plasmonic surface. A plasmonic cavity 342 created by an assembly 340 of the first plasmonic surface, the second plasmonic surface, and the dielectric-filed gap, and having a spectrally separated first fundamental resonant cavity wavelength $\lambda_1$ and second fundamental resonant cavity wavelength $\lambda_2$. Each plasmonic apparatus of the plurality of plasmonic apparatus includes a plurality of fluorescent particles 350 located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$. An application to the gain medium of an electron pumping excitation at the first fundamental resonant cavity wavelength $\lambda_1$ produces an amplified electromagnetic wave emission from the gain medium at the second fundamental resonant cavity wavelength $\lambda_2$. In an embodiment, the amplified electromagnetic wave emission includes emitting electromagnetic waves or photons at the second fundamental resonant cavity wavelength $\lambda_2$ having a higher energy level than the applied electromagnetic waves or photons at first fundamental resonant cavity wavelength $\lambda_1$. In an embodiment, a photoexcitation of the gain medium of at the first fundamental resonant cavity wavelength $\lambda_1$ produces photoluminescence from the gain medium at the second fundamental resonant cavity wavelength $\lambda_2$. In an embodiment, the gain system includes a plasmonic laser system producing a surface plasmon amplification by stimulated emission of radiation. For example, the amplified electromagnetic wave emission may include an amplified visible light emission. For example, the amplified electromagnetic wave emission may include an amplified ultraviolet light emission. For example, the amplified light emission may include an amplified infrared light emission.

In an embodiment of the gain system 300, the amplified electromagnetic wave emission includes an amplified propagating electromagnetic wave. In an embodiment, the amplified electromagnetic wave emission includes an amplified plasmonic radiation. For example, the amplified plasmonic radiation may propagate along a guide, trace, or pathway on the first plasmonic surface 314. In an embodiment, the amplified electromagnetic wave emission includes an amplified visible light emission. In an embodiment, the amplified electromagnetic wave emission includes an amplified ultraviolet light emission. In an embodiment, the amplified electromagnetic wave emission includes an amplified infrared light emission.

In an embodiment, the gain medium 302 includes a laser gain medium. In an embodiment, the gain system 300 includes an electron pumping apparatus configured to excite the gain medium at the first fundamental resonant cavity wavelength $\lambda_1$. In an embodiment, the electron pumping apparatus includes an optical pumping apparatus. For example, an optical pumping system may include a flash lamp, arc lamp, discharge semiconductors, or laser. In an embodiment, the electron pumping apparatus includes an electrical current pumping apparatus. For example, an electrical current pumping apparatus may include semiconductors, or gases via high voltage discharges.

FIG. 5 illustrates an example operational flow 400 for amplifying electromagnetic waves. After a start operation, the operational flow includes a photoexcitation operation 410. The photoexcitation operation includes applying to a gain medium an electron pumping excitation at a first fundamental resonant cavity wavelength $\lambda_1$ of the gain medium. The operational flow includes a photoluminescence operation 420 emitting from the gain medium amplified electromagnetic waves at a second fundamental resonant cavity wavelength 2 of the gain medium. The gain medium includes a plurality of plasmonic apparatus 430. Each plasmonic apparatus of the plurality of plasmonic apparatus includes a substrate has a first negative-permittivity layer comprising a first plasmonic surface. Each plasmonic apparatus includes a plasmonic nanoparticle has a base with a second negative-permittivity layer comprising a second plasmonic surface. Each plasmonic apparatus includes a dielectric-filled gap between the first plasmonic surface and the second plasmonic surface. A plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. Each plasmonic apparatus includes a plurality of fluorescent particles located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$. The application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$. In an embodiment, the amplified electromagnetic wave emission includes an amplified propagating electromagnetic wave. In an embodiment, the amplified electromagnetic wave emission includes an amplified plasmonic radiation. In an embodiment, the amplified electromagnetic wave emission includes an amplified visible light emission. In an embodiment, the amplified electromagnetic wave emission includes an amplified ultraviolet light emission. In an embodiment, the amplified electromagnetic wave emission includes an amplified infrared light emission. The operational flow includes an end operation.

FIG. 6 illustrates an example plasmonic nanoparticle dimer 505. The plasmonic dimer includes a first plasmonic nanoparticle 520.1 having a base 522.1 with a second negative-permittivity layer 524.1 comprising a second plasmonic surface 526.1. The plasmonic dimer includes a second plasmonic nanoparticle 520.2 having a base 522.2 with a second negative-permittivity layer 524.2 comprising a second plasmonic surface 526.2. The plasmonic dimer includes a dielectric-filled gap 530 between the first plasmonic outer surface and the second plasmonic outer surface. A plasmonic cavity 542 created by an assembly 540 of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. The plasmonic dimer includes a plurality of fluorescent particles 550 located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$.

In an embodiment of the plasmonic nanoparticle dimer 505, the first fundamental resonant cavity wavelength $\lambda_1$ is a function of a first characteristic of the first plasmonic nanoparticle 520.1 and a first characteristic of the second plasmonic nanoparticle 520.2. The second fundamental resonant cavity wavelength $\lambda_2$ is a function of a second characteristic of the first plasmonic nanoparticle and a second characteristic of the second nanoparticle. In an embodiment, the first fundamental resonant cavity wavelength $\lambda_1$ is a function of a first structural characteristic of the first plasmonic nanoparticle and a first structural characteristic of the second plasmonic nanoparticle, and the second fundamental resonant cavity wavelength $\lambda_2$ is a function of a second structural characteristic of the first plasmonic nanoparticle and a second structural characteristic of the second nanoparticle. In an embodiment, the first fundamental resonant cavity wavelength $\lambda_1$ is a function of a first dimensional characteristic of the first plasmonic nanoparticle and a first dimensional characteristic of the second plasmonic nanoparticle. The second fundamental resonant cavity wavelength $\lambda_2$ is a function of a second dimensional characteristic of the first plasmonic nanoparticle and a second dimensional characteristic of the second nanoparticle. In an embodiment, the first fundamental resonant cavity wavelength $\lambda_1$ is a function of a first side dimension of a non-square rectangular base of the first plasmonic nanoparticle and a first side dimension of a non-square rectangular base of the second plasmonic nanoparticle. The second fundamental resonant cavity wavelength $\lambda_2$ is a function of a second side dimension of the non-square rectangular base of the first of the first plasmonic nanoparticle and a second side dimension of the non-square rectangular base of the second nanoparticle.

In an embodiment of the plasmonic nanoparticle dimer 505, the first negative-permittivity layer 524.1 includes a metallic layer. In an embodiment of the plasmonic nanoparticle dimer, the second negative-permittivity layer 524.2 includes a metallic layer.

In an embodiment of the plasmonic nanoparticle dimer 505, the dielectric-filled gap 530 includes a non-electrically conductive dielectric-filled gap. In an embodiment, the dielectric-filled gap includes a dielectric film or dielectric coating applied to the first plasmonic nanoparticle. In an embodiment, the dielectric-filled gap includes at least one dielectric element projecting outward from the first plasmonic outer surface. In an embodiment, the dielectric-filled gap includes a dielectric spacer element coupled with the first plasmonic outer surface. In an embodiment, the dielectric-filled gap includes a dielectric-filled gap separating the first plasmonic outer surface from the second plasmonic outer surface. In an embodiment, the dielectric-filled gap is configured to establish or maintain a selected dielectric-filled gap between the first plasmonic outer surface and the second plasmonic outer surface. In an embodiment, the dielectric-filled gap is configured to establish or maintain a dielectric-filled gap between the first plasmonic outer surface and the second plasmonic outer surface. In an embodiment, the dielectric-filled gap is configured to establish a minimum dielectric-filled gap between the first plasmonic outer surface and the second plasmonic outer surface. In an embodiment, the dielectric-filled gap is less than a maximum chord length of the first plasmonic nanoparticle. In an embodiment, the dielectric-filled gap is less than about 10 percent of the maximum chord length of the first plasmonic nanoparticle. In an embodiment, the dielectric-filled gap is greater than about 0.05 percent of the maximum chord length of the first plasmonic nanoparticle. In an embodiment, the dielectric-filled gap has a thickness 532 of less than about 50 nm. In an embodiment, the dielectric-filled gap has a thickness less than about 20 nm. In an embodiment, the dielectric-filled gap has a thickness of less than about 10 nm.

In an embodiment, a gas, fluid, or solid gain medium 560 carries the plasmonic nanoparticle dimer 505. In an embodiment, a gas, fluid, or solid colloid gain medium carries the plasmonic nanoparticle dimer.

Figure 7:
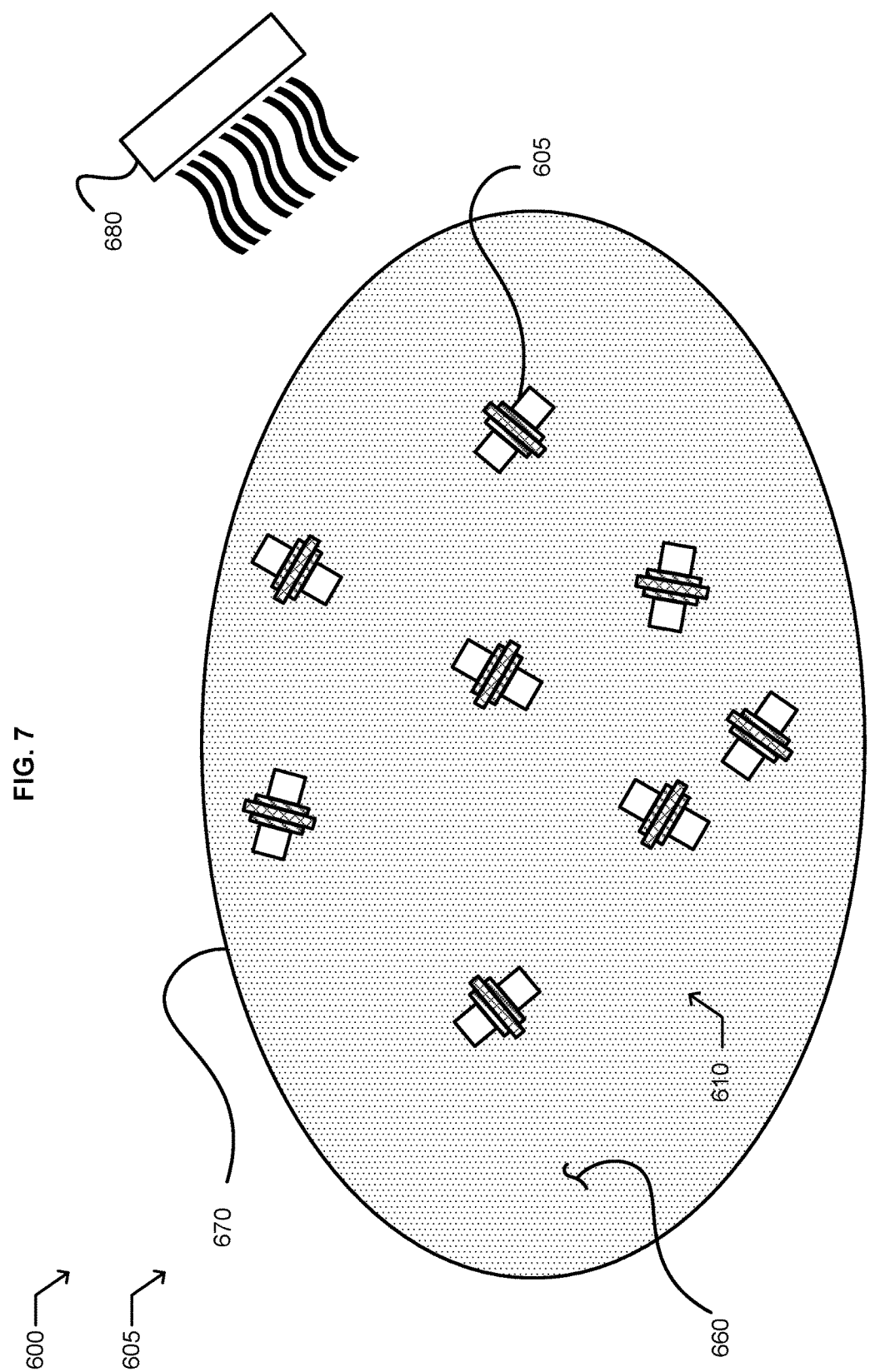
FIG. 7 illustrates an environment that includes gain system.

FIG. 7 illustrates an environment 600 that includes an electromagnetic wave gain system 605. The gain system includes a dispersion 610 of a plurality of plasmonic nanoparticle dimers 605 in a gain medium 660. In an embodiment, at least one dimer of the plurality plasmonic nanoparticle dimers 605 is substantially similar to the plasmonic nanoparticle dimer 505 described in conjunction with FIG. 6. Using the plasmonic nanoparticle dimer 505 to illustrate the plasmonic nanoparticle dimers 605, the plasmonic dimer includes a first plasmonic nanoparticle 520.1 having a base 522.1 with a second negative-permittivity layer 524.1 comprising a second plasmonic surface 526.1. The plasmonic dimer includes a second plasmonic nanoparticle 520.2 having a base 522.2 with a second negative-permittivity layer 524.2 comprising a second plasmonic surface 526.2. The plasmonic dimer includes a dielectric-filled gap 530 between the first plasmonic outer surface and the second plasmonic outer surface. A plasmonic cavity 542 created by an assembly 540 of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. The plasmonic dimer includes a plurality of fluorescent particles 550 located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$. The gain system includes a gain medium 670. An application to the gain medium of an electron pumping excitation at the first fundamental resonant cavity wavelength $\lambda_1$ produces an amplified electromagnetic wave emission from the gain medium at the second fundamental resonant cavity wavelength $\lambda_2$. In an embodiment, the amplified electromagnetic wave emission includes an amplified propagating electromagnetic wave. In an embodiment, the amplified electromagnetic wave emission includes an amplified plasmonic radiation. In an embodiment, the amplified electromagnetic wave emission includes an amplified visible light emission. In an embodiment, the amplified electromagnetic wave emission includes an amplified ultraviolet light emission. In an embodiment, the amplified electromagnetic wave emission includes an amplified infrared light emission.

In an embodiment, the gain medium 670 includes a colloid mixture. In an embodiment, the gain medium includes a fluid. In an embodiment, the gain medium includes a solid. In an embodiment, the gain medium includes a gas. In an embodiment, the gain system 605 includes a container configured to hold the gain medium. In an embodiment, the gain system includes an electron pumping apparatus 680 configured to excite the gain medium at the first fundamental resonant cavity wavelength $\lambda_1$. In an embodiment, the electron pumping apparatus includes an optical pumping apparatus.

Figure 8:
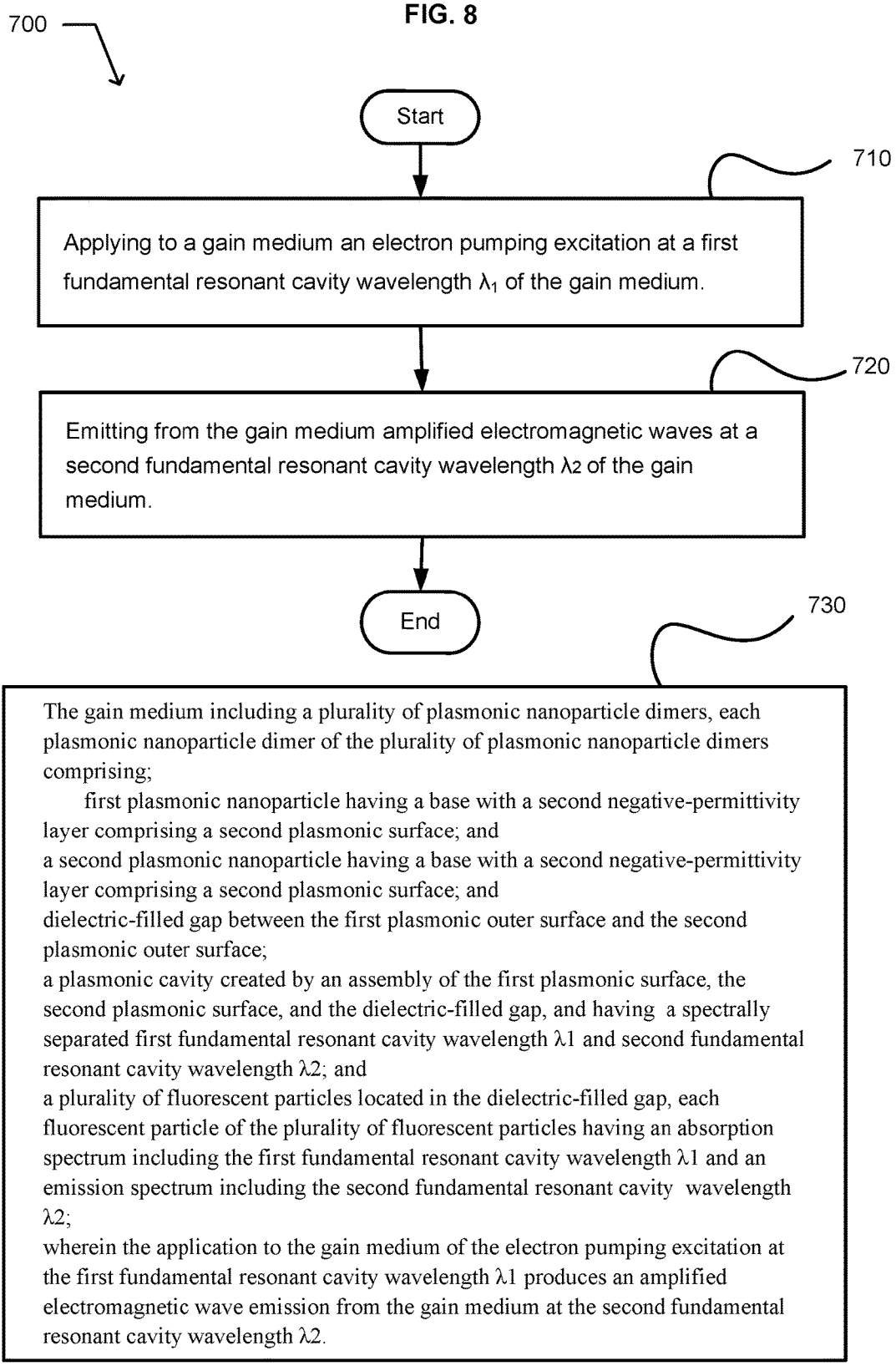
FIG. 8 illustrates an example operational flow. After a start operation, the operational flow includes a photoexcitation operation.

FIG. 8 illustrates an example operational flow 700. After a start operation, the operational flow includes a photoexcitation operation 710. The photoexcitation operation includes applying to a gain medium an electron pumping excitation at a first fundamental resonant cavity wavelength $\lambda_1$ of the gain medium. In an embodiment, the photoexcitation operation may be implemented using the electron pumping apparatus 680 to excite the gain system 605 described in conjunction with FIG. 7. The operational flow includes a photoluminescence operation 720 emitting from the gain medium amplified electromagnetic waves at a second fundamental resonant cavity wavelength $\lambda_2$ of the gain medium. The gain medium includes a plurality of plasmonic nanoparticle dimers 730. Each plasmonic nanoparticle dimer of the plurality of plasmonic nanoparticle dimers includes a first plasmonic nanoparticle having a base with a second negative-permittivity layer comprising a second plasmonic surface. Each plasmonic nanoparticle dimer of the plurality of plasmonic nanoparticle dimers includes a second plasmonic nanoparticle having a base with a second negative-permittivity layer comprising a second plasmonic surface. Each plasmonic nanoparticle dimer of the plurality of plasmonic nanoparticle dimers includes dielectric-filled gap between the first plasmonic outer surface and the second plasmonic outer surface. A plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$. Each plasmonic nanoparticle dimer of the plurality of plasmonic nanoparticle dimers includes a plurality of fluorescent particles located in the dielectric-filled gap. Each fluorescent particle of the plurality of fluorescent particles has an absorption spectrum including the first fundamental resonant cavity wavelength $\lambda_1$ and an emission spectrum including the second fundamental resonant cavity wavelength $\lambda_2$, wherein the application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$. The operational flow includes an end operation.

All references cited herein are hereby incorporated by reference in their entirety or to the extent their subject matter is not otherwise inconsistent herewith.

In some embodiments, "configured" or "configured to" includes at least one of designed, set up, shaped, implemented, constructed, or adapted for at least one of a particular purpose, application, or function. In some embodiments, "configured" or "configured to" includes positioned, oriented, or structured for at least one of a particular purpose, application, or function.

It will be understood that, in general, terms used herein, and especially in the appended claims, are generally intended as "open" terms. For example, the term "including" should be interpreted as "including but not limited to." For example, the term "having" or "has" should be interpreted as "having at least." For example, the term "has" should be interpreted as "having at least." For example, the term "includes" should be interpreted as "includes but is not limited to," etc. It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An electromagnetic gain system comprising:
a gain medium that includes a plurality of plasmonic apparatus; and
the plurality of plasmonic apparatus, each plasmonic apparatus of the plurality of plasmonic apparatus comprising:
a substrate having a first negative-permittivity layer comprising a first plasmonic surface;
a plasmonic nanoparticle having a base with a second negative-permittivity layer comprising a second plasmonic surface;
a dielectric-filled gap between the first plasmonic surface and the second plasmonic surface;
a plasmonic cavity created by an assembly of the first plasmonic surface, the second plasmonic surface, and the dielectric-filed gap, and having a spectrally separated first fundamental resonant cavity wavelength $\lambda_1$ and second fundamental resonant cavity wavelength $\lambda_2$; and
a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$,
wherein an application to the gain medium of an electron pumping excitation at the first fundamental resonant cavity wavelength $\lambda_1$ produces an amplified electromagnetic wave emission from the gain medium at the second fundamental resonant cavity wavelength $\lambda_2$.

2. The gain system of claim 1, wherein the amplified electromagnetic wave emission includes an amplified propagating electromagnetic wave.

3. The gain system of claim 1, wherein the amplified electromagnetic wave emission includes an amplified plasmonic radiation.

4. The gain system of claim 1, wherein the gain medium includes a laser gain medium.

5. The gain system of claim 1, further comprising:
an electron pumping apparatus configured to excite the gain medium at the first fundamental resonant cavity wavelength $\lambda_1$.

6. The gain system of claim 1, wherein the electron pumping apparatus includes an electrical current pumping apparatus.

7. A method for amplifying electromagnetic waves comprising:
applying to a gain medium an electron pumping excitation at a first fundamental resonant cavity wavelength $\lambda_1$ of the gain medium; and
emitting from the gain medium amplified electromagnetic waves at a second fundamental resonant cavity wavelength $\lambda_2$ of the gain medium,
the gain medium including a plurality of plasmonic apparatus, each plasmonic apparatus of the plurality of plasmonic apparatus comprising:
a substrate having a first negative-permittivity layer comprising a first plasmonic surface;
a plasmonic nanoparticle having a base with a second negative-permittivity layer comprising a second plasmonic surface;
a dielectric-filled gap between the first plasmonic surface and the second plasmonic surface;
a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$; and
a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$;
wherein the application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$.

8. The method of claim 7, wherein the amplified electromagnetic wave emission includes an amplified visible light emission.

9. The method of claim 7, wherein the amplified electromagnetic wave emission includes an amplified ultraviolet light emission.

10. A plasmonic nanoparticle dimer comprising:
a first plasmonic nanoparticle having a base with a first negative-permittivity layer comprising a first plasmonic surface;
a second plasmonic nanoparticle having a base with a second negative-permittivity layer comprising a second plasmonic surface;
dielectric-filled gap between the first plasmonic outer surface and the second plasmonic outer surface;
a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$; and
a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$.

11. The plasmonic nanoparticle dimer of claim 10, wherein the first fundamental resonant cavity wavelength $\lambda_1$ is a function of a first characteristic of the first plasmonic nanoparticle and a first characteristic of the second plasmonic nanoparticle, and the second fundamental resonant cavity wavelength $\lambda_2$ is a function of a second characteristic of the first plasmonic nanoparticle and a second characteristic of the second nanoparticle.

12. The plasmonic nanoparticle dimer of claim 11, wherein the first fundamental resonant cavity wavelength $\lambda_1$ is a function of a first structural characteristic of the first plasmonic nanoparticle and a first structural characteristic of the second plasmonic nanoparticle, and the second fundamental resonant cavity wavelength $\lambda_2$ is a function of a second structural characteristic of the first plasmonic nanoparticle and a second structural characteristic of the second nanoparticle.

13. The plasmonic nanoparticle dimer of claim 10, wherein the first fundamental resonant cavity wavelength $\lambda_1$ is a function of a first dimensional characteristic of the first plasmonic nanoparticle and a first dimensional characteristic of the second plasmonic nanoparticle, and the second fundamental resonant cavity wavelength $\lambda_2$ is a function of a second dimensional characteristic of the first plasmonic nanoparticle and a second dimensional characteristic of the second nanoparticle.

14. The plasmonic nanoparticle dimer of claim 10, wherein the first fundamental resonant cavity wavelength $\lambda_1$ is a function of a first side dimension of a non-square rectangular base of the first plasmonic nanoparticle and a first side dimension of a non-square rectangular base of the second plasmonic nanoparticle, and the second fundamental resonant cavity wavelength $\lambda_2$ is a function of a second side dimension of the non-square rectangular base of the first of the first plasmonic nanoparticle and a second side dimension of the non-square rectangular base of the second nanoparticle.

15. The plasmonic nanoparticle dimer of claim 10, wherein the first negative-permittivity layer includes a metallic layer.

16. The plasmonic nanoparticle dimer of claim 10, wherein the second negative-permittivity layer includes a metallic layer.

17. The plasmonic nanoparticle dimer of claim 10, wherein the dielectric-filled gap includes a non-electrically conductive dielectric-filled gap.

18. The plasmonic nanoparticle dimer of claim 10, wherein the dielectric-filled gap includes a dielectric spacer element coupled with the first plasmonic outer surface.

19. The plasmonic nanoparticle dimer of claim 10, wherein the dielectric-filled gap is configured to establish or maintain a dielectric-filled gap between the first plasmonic outer surface and the second plasmonic outer surface.

20. The plasmonic nanoparticle dimer of claim 10, wherein the dielectric-filled gap is less than a maximum chord length of the first plasmonic nanoparticle.

21. The plasmonic nanoparticle dimer of claim 20, wherein the dielectric-filled gap is less than about 10 percent of the maximum chord length of the first plasmonic nanoparticle.

22. The plasmonic nanoparticle dimer of claim 20, wherein the dielectric-filled gap is greater than about 0.05 percent of the maximum chord length of the first plasmonic nanoparticle.

23. The plasmonic nanoparticle dimer of claim 10, wherein the dielectric-filled gap is less than about 50 nm.

24. The plasmonic nanoparticle dimer of claim 10, wherein the dielectric-filled gap is less than about 10 nm.

25. The plasmonic nanoparticle dimer of claim 10, further comprising:
a gas, fluid, or solid gain medium carrying the plasmonic nanoparticle dimer.

26. The plasmonic nanoparticle dimer of claim 10, further comprising:
a gas, fluid, or solid colloid gain medium carrying the plasmonic nanoparticle dimer.

27. An electromagnetic wave gain system comprising:
a dispersion of a plurality of plasmonic nanoparticle dimers in a gain medium;
each plasmonic nanoparticle dimer of the plurality of plasmonic nanoparticle dimers comprising;
first plasmonic nanoparticle having a base with a second negative-permittivity layer comprising a second plasmonic surface;
a second plasmonic nanoparticle having a base with a second negative-permittivity layer comprising a second plasmonic surface;
dielectric-filled gap between the first plasmonic outer surface and the second plasmonic outer surface;
a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$; and
a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$; and
the gain medium,
wherein an application to the gain medium of an electron pumping excitation at the first fundamental resonant cavity wavelength $\lambda_1$ produces an amplified electromagnetic wave emission from the gain medium at the second fundamental resonant cavity wavelength $\lambda_2$.

28. The optical gain system of claim 27, further comprising:
a container configured to hold the gain medium.

29. The gain system of claim 27, further comprising:
an electron pumping apparatus configured to excite the gain medium at the first fundamental resonant cavity wavelength $\lambda_1$.

30. The gain system of claim 29, wherein the electron pumping apparatus includes an optical pumping apparatus.

31. A method for amplifying electromagnetic waves comprising:
applying to a gain medium an electron pumping excitation at a first fundamental resonant cavity wavelength $\lambda_1$ of the gain medium; and
emitting from the gain medium amplified electromagnetic waves at a second fundamental resonant cavity wavelength $\lambda_2$ of the gain medium,
the gain medium including a plurality of plasmonic nanoparticle dimers, each plasmonic nanoparticle dimer of the plurality of plasmonic nanoparticle dimers comprising;

first plasmonic nanoparticle having a base with a first negative-permittivity layer comprising a first plasmonic surface; and a second plasmonic nanoparticle having a base with a second negative-permittivity layer comprising a second plasmonic surface; and dielectric-filled gap between the first plasmonic outer surface and the second plasmonic outer surface;

a plasmonic cavity created by an assembly of the first plasmonic surface, the second plasmonic surface, and the dielectric-filled gap, and having a spectrally separated first fundamental resonant cavity wavelength $\lambda_1$ and second fundamental resonant cavity wavelength $\lambda_2$; and a plurality of fluorescent particles located in the dielectric-filled gap, each fluorescent particle of the plurality of fluorescent particles having an absorption spectrum including the first fundamental resonant cavity wavelength $\lambda_1$ and an emission spectrum including the second fundamental resonant cavity wavelength $\lambda_2$;

wherein the application to the gain medium of the electron pumping excitation at the first fundamental resonant cavity wavelength $\lambda_1$ produces an amplified electromagnetic wave emission from the gain medium at the second fundamental resonant cavity wavelength $\lambda_2$.

* * * * *